(12) United States Patent
Hollis

(10) Patent No.: US 7,821,108 B2
(45) Date of Patent: Oct. 26, 2010

(54) SYSTEMS AND METHODS FOR LOWERING INTERCONNECT CAPACITANCE THROUGH ADJUSTMENT OF RELATIVE SIGNAL LEVELS

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 12/168,087

(22) Filed: Jul. 4, 2008

(65) Prior Publication Data
US 2010/0001789 A1    Jan. 7, 2010

(51) Int. Cl.
*H01L 29/72* (2006.01)
(52) U.S. Cl. ............. 257/621; 257/532; 257/545; 257/664; 257/698; 257/774; 257/777
(58) Field of Classification Search ........... 257/532, 257/545, 621, 664, 698, 774, 777
See application file for complete search history.

(56) References Cited
U.S. PATENT DOCUMENTS
6,589,180 B2 *  7/2003  Erikson et al. ............. 600/459

OTHER PUBLICATIONS

U.S. Appl. No. 12/106,552, filed Apr. 21, 2008, Hollis.
U.S. Appl. No. 12/101,770, filed Apr. 11, 2008, Lee.

* cited by examiner

*Primary Examiner*—Edward Wojciechowicz
(74) *Attorney, Agent, or Firm*—Wong, Cabello, Lutsch, Rutherford & Brucculeri, LLP

(57) ABSTRACT

Methods and circuitry for lowering the capacitance of interconnects, particularly Through Wafer Interconnects (TWIs), using signal level adjustment are disclosed. Embodiments of the invention seek to bias the midpoint voltage level of the signals on the TWIs towards inversion, where at high frequencies capacitance is at its minimum. In one embodiment, reduced swing signals are used for the data states transmitted across the TWIs, in which the reduced swing signals use a midpoint voltage level tending to bias the TWI capacitance towards inversion. In another embodiment, signals are AC coupled to the TWI where they are referenced to an explicit bias voltage directly connected to the TWI. This allows signals to propagate through the TWI while the TWI is biased towards inversion. In a third embodiment, the potential of the substrate is explicitly lowered with respect to the TWI potential. Regardless of the particular embodiment used, raising the midpoint-voltage level of the signals on the TWIs relative to the substrate decreases capacitance, which increases the frequency of the data which can propagate through the TWIs while potentially reducing the signaling power.

26 Claims, 12 Drawing Sheets

//PAGE_START
SYSTEMS AND METHODS FOR LOWERING INTERCONNECT CAPACITANCE THROUGH ADJUSTMENT OF RELATIVE SIGNAL LEVELS

FIELD OF THE INVENTION

Embodiments of the invention relate to lowering the capacitance of interconnects, and in particular Through Wafer Interconnects (TWIs).

BACKGROUND

As semiconductor technology progresses, designers continue to find ways to assemble multiple integrated circuits (ICs) into denser arrangements. One such arrangement disclosed in U.S. patent application Ser. No. 12/136,868, filed Jun. 11, 2008, is shown in FIG. 1, with which familiarity is assumed. Illustrated there is a memory system 100 mounted to a printed circuit board (PCB) 30. The system 100 includes a standard memory controller 12. Memory controllers 12 are well known in the art and work to create a standard interface with which a microprocessor or other memory querying system (not shown) can predictably communicate. Memory controller 12 typically comprises an integrated circuit separate and independent from other components in the system 100, but this is not strictly necessary, and the controller 12 could be integrated with other components if desired. The memory controller is affixed to the PCB 30 using solder bumps 80, as is typical.

Also present in system 100 is a multi-IC system 40. The multi-IC system 40 integrates a logic IC 14 and a set 25 of modified Random Access Memory (RAM) ICs $16_x$ into a single package. As discussed in the above-mentioned '868 application, the logic IC 14 can contain logic circuits traditionally present on memory integrated circuits, as well as other circuits relevant to integration. As a result of these logic circuits being moved onto the logic IC 14, the modified RAM ICs $16_x$ need not contain such circuits, and can therefore be made smaller. The multi-IC system 40 is also affixed to the PCB 30 using solder bumps 82.

As shown, the logic IC 14 and the modified RAM ICs $16_x$ are vertically stacked in the multi-IC system 40 within a singular package. ("Vertical" in this context should be understood as being generally perpendicular to the major plane of an IC). To facilitate the running of the signals between the various ICs in the multi-IC system, interconnects, such as Through Wafer Interconnects (TWIs) 83, run though the logic IC 14 and the modified RAM ICs $16_x$. As is well known, the TWIs 83 comprise a conductive plug of material set in a hole that has been milled, drilled, or etched through the substrate 85 of each of the ICs. The tops and bottoms of the TWIs 83 are made to communicate with TWIs on adjacent ICs in the stack via solder bumps 84, in effect creating a bus 15 within the multi-IC system 40 common to at least some of the ICs in the system (e.g., the modified RAM ICs $16_x$). Each set 41 of TWIs 83 thus passes a signal vertically through the multi-IC system 40.

FIG. 2 shows multi-IC system 40 in a schematic form. Bus 15 is apparent, which as mentioned above is formed from the various TWIs 83 in the logic IC 14 and the modified RAM ICs $16_x$, and from solder bumps 84 that connect them. As drawn, it is assumed that there are 'n' signals in the bus 15, and 'i' modified RAM ICs $16_x$. As is typical, each IC contains transmitter (T) and receiver (R) circuitry for driving and sensing data on the bus 15. Thus, T(x,y) represents the transmission circuitry used to send data from the $x^{th}$ modified RAM IC 16 onto the $y^{th}$ of the traces in bus 15; likewise, R(x,y) represents the transmission circuitry used to sense data at the $x^{th}$ modified RAM IC 16 from the $y^{th}$ of the traces in bus 15. T(L,y) and R(L,y) respectively represent the transmission and receiver circuitry for the logic IC 14.

As one skilled in the art will realize, which of the transmission or reception circuitry is enabled at any given time on a given IC depends on the particular action that is occurring within the multi-IC system 40. For example, if data is being written in parallel from the logic IC 14 to the second modified RAM IC $16_2$ along bus traces 1 though 8, then T(L,1) through T(L, 8) would be activated on the logic IC 14 along with R(2,1) through R(2,8) on the modified RAM IC $16_2$. If data transfer occurs in the other direction, i.e., if data is read from modified RAM IC $16_2$, then R(L,1) through R(L,8) would be activated on the logic IC 14 along with T(2,1) through T(2,8) on the modified RAM IC $16_2$. Some of the traces may not allow for two-way transmission. For example, bus trace n-1 as illustrated can only pass data from the logic IC 14 to the RAM ICs $16_x$, perhaps because such a trace merely contains a control signal for the RAM ICs.

Vertical integration makes multi-IC system 40 physically more compact, such that it takes up less area on PCB 30 than would its individual ICs (14; 161 through 16i) if arrayed on the PCB 30. Equally important, vertical integration minimizes the distance signals must travel between the ICs, i.e., it shortens the lengths of the traces that comprise bus 15. Shorter traces theoretically allow signals to travel more quickly on the bus 15. More importantly, shorter traces may reduce transmission line effects (e.g., signal reflections) and the capacitive loading seen by the transmitter, the latter of which either allows for an increased number of destinations, or lower power for a given number of destinations. Quicker signal transmission is of great benefit in modern-day systems 100 in which designers desire to send signals at ever-increasing speeds.

DETAILED DESCRIPTION

Methods and circuitry for lowering the capacitance of interconnects, particularly Through Wafer Interconnects (TWIs), using signal level adjustment are disclosed. Embodiments of the invention seek to bias the midpoint voltage level of the signals on the TWIs towards inversion, where at high frequencies capacitance is at its minimum. In one embodiment, reduced swing signals are used for the data states transmitted across the TWIs, in which the reduced swing signals use a midpoint voltage level tending to bias the TWI capacitance towards inversion. For a typical P-doped substrate, this means that reduced swing—high midpoint-voltage signaling would be used. In another embodiment, signals are AC coupled to the TWI where they are referenced to an explicit bias voltage directly connected to the TWI. This allows signals to propagate through the TWI while the TWI is biased towards inversion, i.e., using a bias potential more positive than the substrate potential for the case of a P-doped substrate. In a third embodiment, the potential of the substrate is explicitly lowered with respect to the TWI potential. Regardless of the particular embodiment used, raising the midpoint-voltage level of the signals on the TWIs relative to the substrate decreases capacitance, which increases the frequency of the data which can propagate through the TWIs while potentially reducing the signaling power. In addition such techniques may further aid in TWI modeling by providing a relatively constant capacitance regardless of data state.

Figure 3:
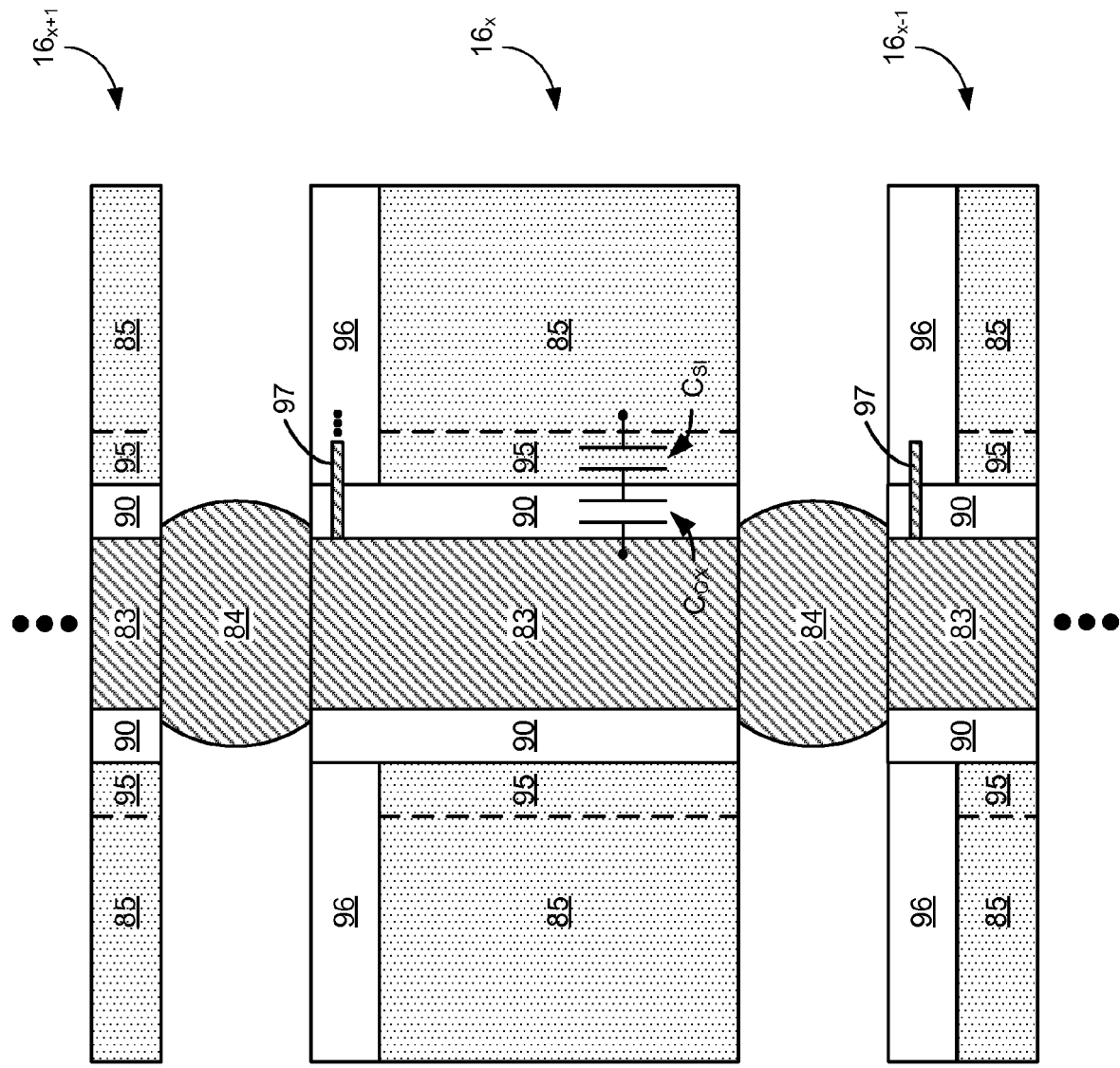
FIG. 3 illustrates a cross sectional view of a TWI in the bus, and illustrates the capacitance inherent in such structure.

A cross section of a TWI 83, as it would appear in a vertically-stacked multi-IC system, is shown in FIG. 3. Also visible are certain aspects of the integrated circuits $16_x$ through which the TWI 83 progresses, including the substrate 85, which is typically a grounded, lightly-P-doped silicon substrate. It is assumed here for consistency with the Background section that the integrated circuits comprise modified RAM ICs $16_x$, but this is merely exemplary and the vertical stack could comprise any integrated circuits.

So as to prevent the TWI 83 from shorting to the substrate 85, a dielectric 90 is used, which dielectric is usually silicon dioxide but can be any dielectric typically used in semiconductor processing. Methods for manufacturing TWIs 83 in the manner illustrated are well known and need not be reiterated here.

Also visible near the top of the integrated circuits is the active circuitry 96, which is built in the upper portion of the ICs $16_x$ in accordance with standard semiconductor processing techniques. Such active circuitry could include standard structures and layers, such as transistor gates, metal interconnect layers, the various dielectric layers used for insulation, etc.

Figure 5:
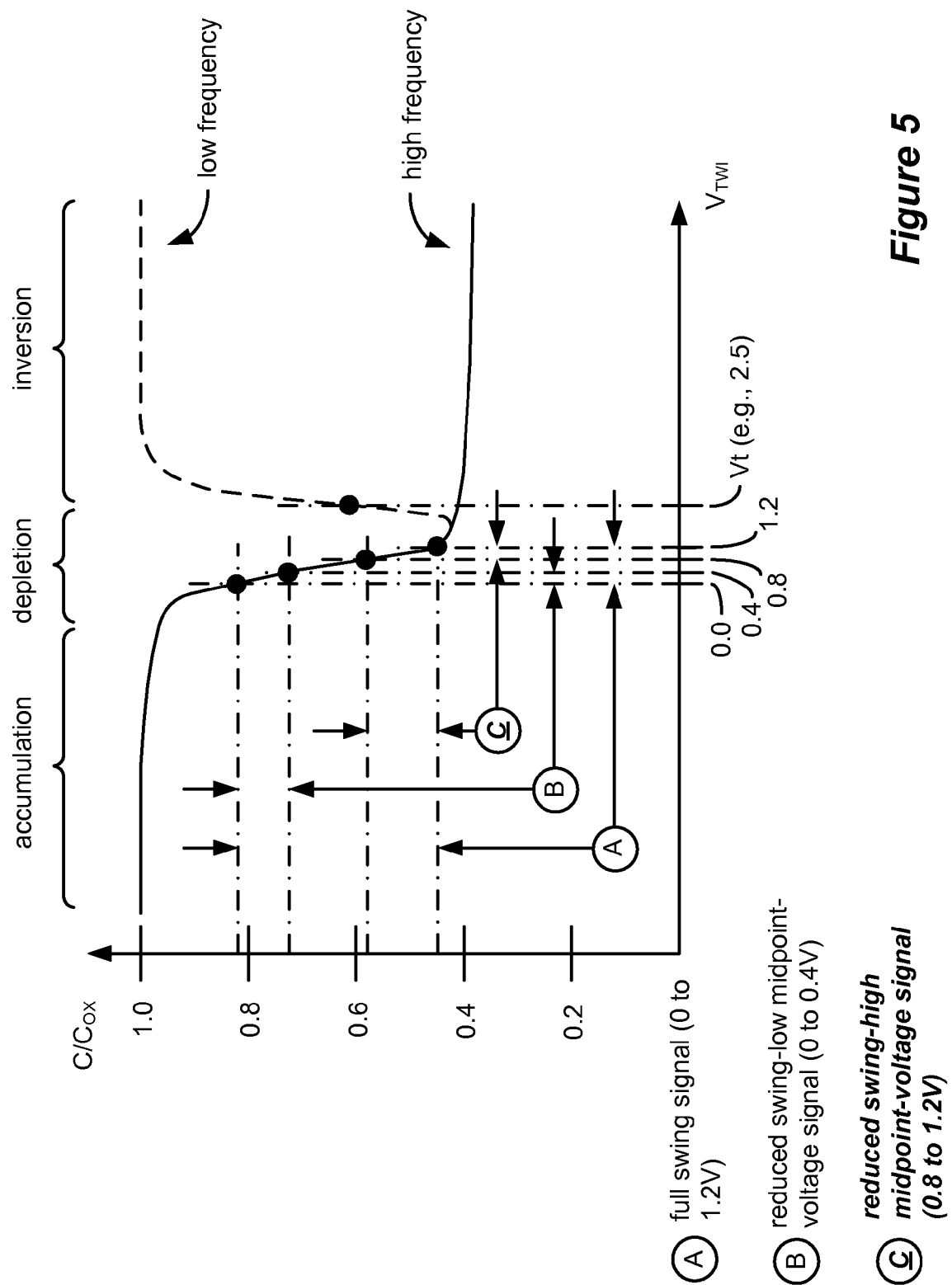
FIG. 5 illustrates how the use of reduced swing—high midpoint-voltage signals reduces TWI capacitance.

It is noticed by the Applicant that the TWI 83 comprises a MOS capacitor arising from the cylindrical TWI 83/dielectric 90/substrate 85 configuration. The resulting capacitance will be variable depending on the voltage on the TWI 83 at any given time. This voltage-dependent capacitance is shown in FIG. 5, which those skilled in semiconductor physics will recognize as capacitance-voltage (CV) curves for a MOS capacitor. Graphed are the CV curves for the TWI 83 operating both at high frequency (solid line) and at low frequency (dotted line). Given the speed of the signals which will typically travel through the TWIs 83 in modern-day systems, the high frequency curve is the relevant curve for the purpose of discussion. However, the low frequency curve is included in FIG. 5 because it allows for easy visualization of the threshold voltage (Vt) of the TWI 83, which is roughly at the intersection between the depletion and inversion regions (more on this below). The Vt of the TWI 83 will depend on several factors, such as the doping level of the substrate 85 and the thickness of the dielectric 90 used to insulate the TWIs 83. However, for a typical application, it can be assumed that the Vt of the TWI 83 will be (or can be tailored to be) approximately 2.5V.

The MOS capacitance resulting from the TWI 83 structure is reflected in three different regions: accumulation, depletion, and inversion. Assuming a grounded P-doped substrate 85 is used for the ICs $16_x$, as is usually the case, accumulation generally occurs when the TWI potential is negative with respect to the substrate potential. From this point on, the TWI potential will be referred to as $V_{TWI}$. Such a negative voltage accumulates the majority hole carriers in the substrate at the dielectric 90/substrate 85 interface. In this condition, the TWI 83's capacitance is at a maximum, and comprises the capacitance of the dielectric layer 90, $C_{OX}$, as shown in FIG. 3. As $V_{TWI}$ increases with respect to the substrate potential, the majority hole carriers in the substrate 85 are eventually repelled away from the interface, creating a depletion layer 95 (FIG. 3) in the substrate 85 substantially devoid of charge carriers and thus acting essentially as a dielectric. As shown in FIG. 3, this depletion layer gives rise to a capacitance, $C_{SI}$, in series with the dielectric 90 capacitance, $C_{OX}$, which capacitance decreases as $V_{TWI}$ increases. This causes the overall capacitance to fall, as shown in FIG. 5. When $V_{TWI}$ is further increased, it will eventually equal the threshold voltage, Vt, of the TWI 83, at which point the inversion region is entered. During inversion, a channel will form at the interface comprised of minority electron carriers from the substrate 85. These minority carriers are unable to react quickly enough to high frequencies (e.g., greater than 100 Hertz), and so the channel remains dielectric in nature, and the overall capacitance for the TWI 83 is at its minimum value. (At low frequencies, the minority carriers can respond such that the channel no longer acts as a dielectric, and thus the capacitance will once again increase as shown by the dotted line in FIG. 5. However, as mentioned previously, such low frequencies are typically not relevant to the type of high speed signaling for which TWIs are typically employed).

The Applicant has noticed that the reality of the capacitive nature of the TWI 83 has real implications for the transmission of signals through the bus 15. For example, typical systems today operate at power supplies of Vdd=1.2V and Vss=0.0V=GND, such that the data passed on the bus 15 and through the TWI 83s is 1.2V (a logic '1') or 0.0V (a logic '0'), i.e., ranges around a midpoint voltage of 0.6 V. Because the transmitted data has a range equal to the power supply voltages, such a data transmission scheme can be referred to as "full swing." Other systems have been described in which reduced swing architectures are used to transmit signals across a bus. For example, U.S. patent application Ser. No. 12/106,552, filed Apr. 21, 2008, which is incorporated herein by reference in its entirety, discusses a system in which data is transferred between devices with a reduced swing signal, e.g., at 0.4V (logic '1') and 0.0V (logic '0'), even though the transmitter and receiver employed operate at standard 1.2V/0.0V power supplies. Because the voltages of these signals (0.0V, 0.4V) range less than the range of the power supply voltages (0.0V, 1.2V), and because the range is around a relatively low midpoint voltage of 0.2V, such data transmission can be referred to as a "reduced swing—low midpoint-voltage" scheme. The '552 application also discloses the concept of transmission of data with a reduced swing, but with higher DC levels referenced to the upper power supply voltage, e.g., with data transmitted at 0.8V (logic '0') and 1.2V (logic '1') around a midpoint voltage of 1.0V. Such data transmission can be referred to as a "reduced swing—high midpoint-voltage" scheme.

It is recognized by the Applicant that the full swing data transmission scheme and the reduced swing—low midpoint-voltage data transmission scheme are not optimal from a capacitance standpoint when used in busses 15 incorporating TWIs 83. This is illustrated in FIG. 5, in which the full swing scheme is denoted 'A' and the reduced swing—low midpoint-voltage scheme is denoted 'B.' In both of these schemes, one of the logic states present on the TWI 83 (logic '0') is 0.0V. As shown in FIG. 5, when the voltage on the TWI 83 is 0.0V, the capacitance of the TWI is relatively high, e.g., about 0.8 when normalized to the dielectric capacitance, $C_{OX}$. Such a relatively high capacitance will negatively impact the data sent through the TWI 83. Logic '1' in the reduced swing—low midpoint-voltage scheme ('B'), i.e. 0.4V, also gives rise to a relatively high capacitance of over 0.7 normalized. Logic '1' in the full swing scheme, i.e. 1.2V, gives rise to a smaller capacitance of over 0.4 normalized, but gives rise to a relatively large swing in capacitance between the data states, e.g., from about a little over 0.4 to over 0.8, normalized in the illustrated example. Such data-state-dependent capacitance can distort passing signals make modeling of the bus 15 difficult.

Accordingly, in one embodiment of the invention, a reduced swing—high midpoint-voltage approach is used for data transmission through TWIs 83. This scheme is denoted as 'C' in FIG. 5. Because both of the voltages for the logic states (0.8V; 1.2V) are relatively high, e.g., they range around a relatively high midpoint voltage of 1.0V, they reduce TWI capacitance. Moreover, the swing in capacitance between the data states is not extreme, from a little over 0.4 to a little under 0.6 normalized capacitance. Thus, when a reduced swing—high midpoint-voltage scheme is used, signals can be sent through the TWIs 83 at higher frequencies when compared with the other schemes discussed above. Moreover, because the swing in capacitance is relatively small, modeling of transmission through the TWIs 83 is simplified.

Figure 1:
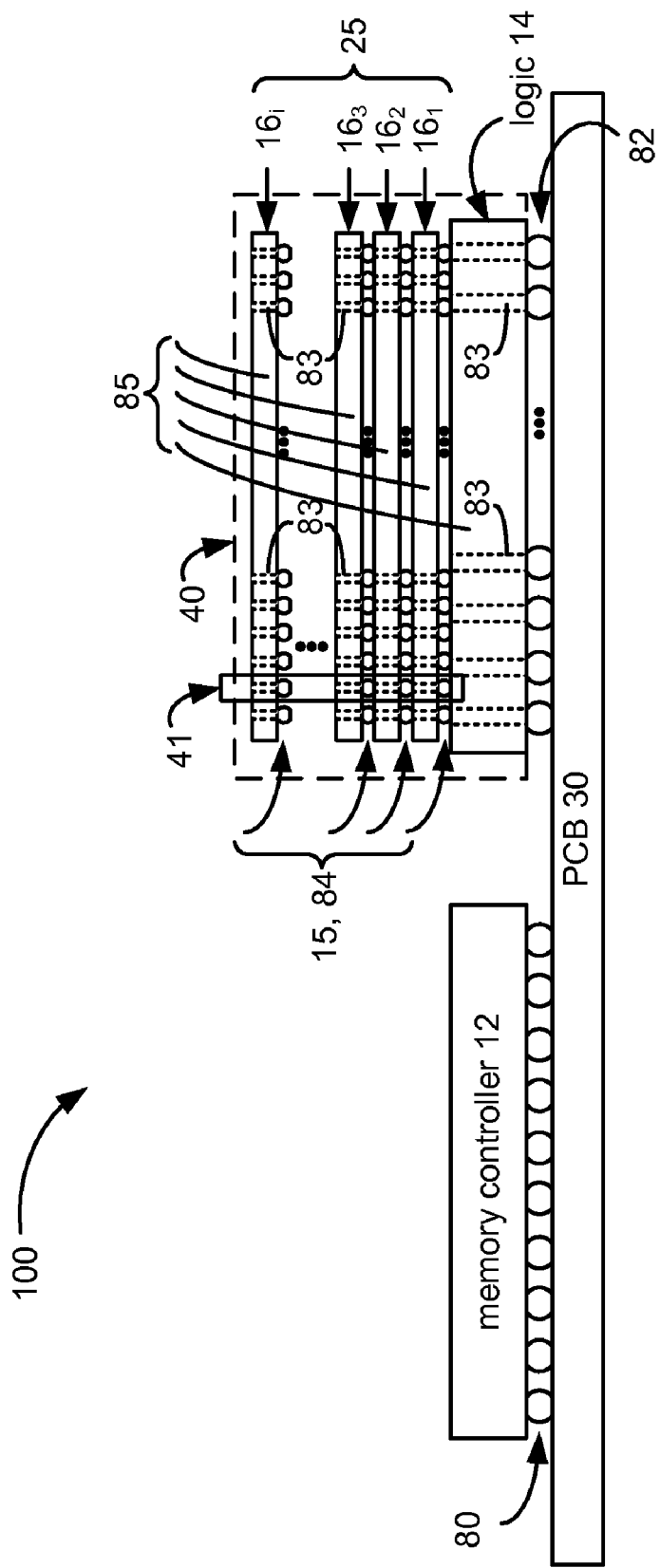
FIG. 1 illustrates a cross section of a vertically-stacked, multi-IC system and the system in which it operates, and specifically shows the use of Through Wafer Interconnects (TWIs) to create a signal bus between the various ICs in the system.
Figure 2:
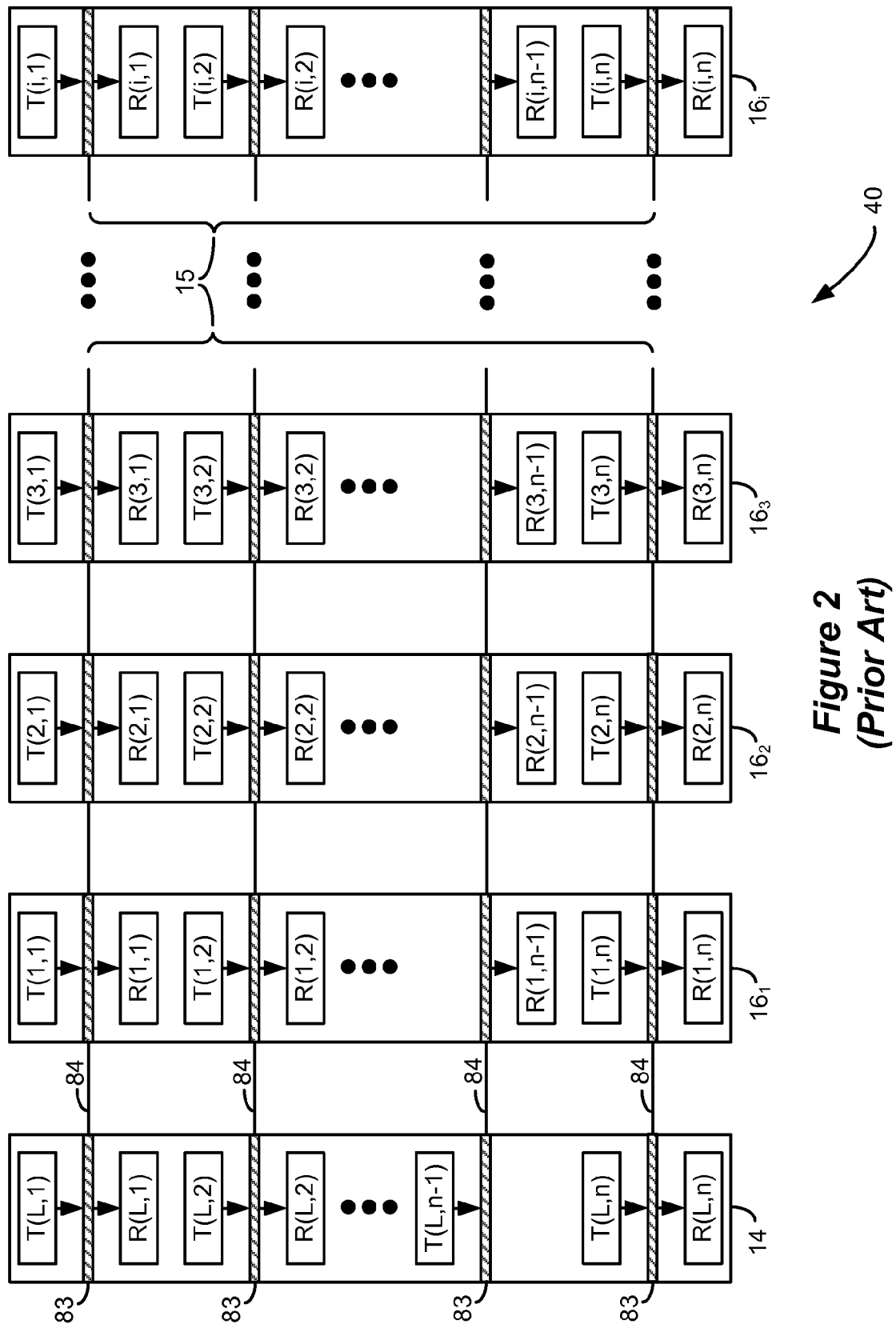
FIG. 2 illustrates a schematic of the transmitter and receiver circuits operating on a TWI-based bus.
Figure 4:
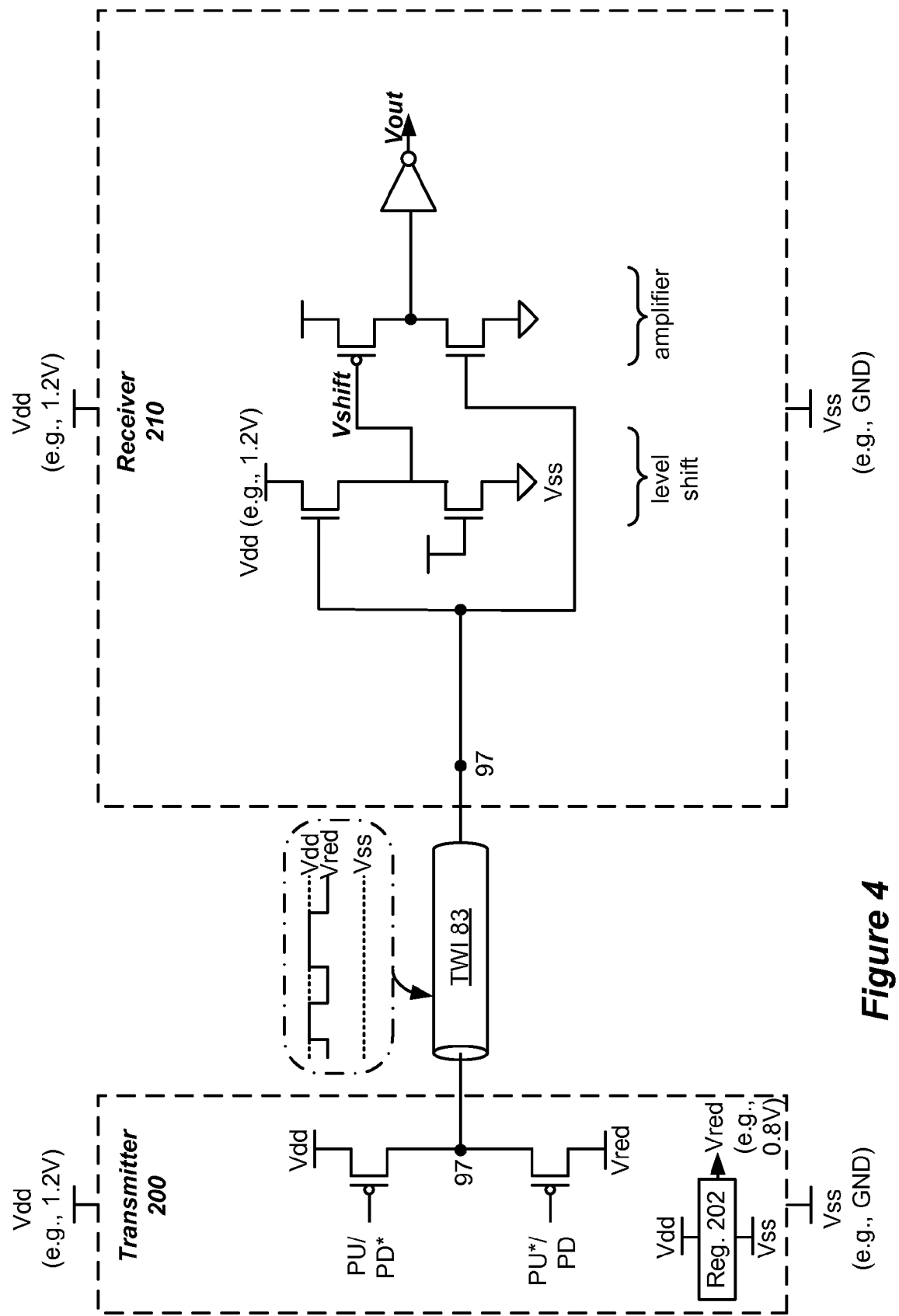
FIG. 4 illustrates transmitter and receiver circuitry useable with the TWI-based bus in accordance with one embodiment of the invention, in which the transmitter and receiver process reduced swing—high midpoint-voltage signals to reduce TWI capacitance.

Transmission and receiver circuitry 200 and 210 for producing and sensing reduced swing—high midpoint-voltage signals are disclosed in FIG. 4. As discussed earlier with respect to FIG. 2, it should be remembered that the active transmitter 200 and the active receiver 210 would be present on different integrated circuits 14, 16$_x$ within the vertically-stacked multi-IC system 40. Additionally, any given integrated circuit could contain both transmitter and receiver circuitry, although this is not shown in FIG. 4 for simplicity. In the example shown, both the transmitter 200 and receiver 210 are powered with main power supplies Vdd (e.g., 1.2V) and Vss (e.g., GND), but this is not strictly necessary.

In one embodiment, the transmitter 200 includes a driver circuit comprised of two serially-connected P-channel transistors, which like other aspects of the transmitter would be fabricated in the active circuitry 96 of one of the ICs (see FIG. 3). Main supply Vdd (1.2V) couples to the top P-channel transistor while a reduced supply, Vred (e.g., 0.8V) couples to the bottom P-channel transistor. Reduced supply Vred can be formed via a regulator circuit 202, which can comprise any well known band gap generator circuit. Alternatively, this reduced supply Vred can be provided from the system outside of the ICs. In any event, how the reduced supply Vred is generated is unimportant. The driver circuitry is controlled by mutually-exclusive pull up (PU)/pull down (PD) signals, such that when PU is asserted (active low), 1.2 V (i.e., a logic '1') is passed to the TWI 83 at node 97; when PD is asserted (active low), 0.8 V (i.e., a logic '0') is passed to the TWI 83 at node 97. Either signal PU or PD, or their complements, may be considered an original signal which is desired to be transmitted on the TWIs 83, and such signal may comprise a full range signal which ranges around a midpoint voltage of 0.6V. By contrast, the modified signal at node 97 comprises a reduced-swing—high midpoint-voltage signal which ranges around a midpoint voltage of 1.0V.

Node 97 is depicted in FIG. 3, and generally comprises a conductive layer direct connection between the TWI 83 and the transmitter 210 (or active circuitry 96 more generally). Because connection of a given conductive layer in an integrated circuit to a TWI 83 is well known in the art, such specifics are not discussed further. One skilled in the art will appreciate that not all TWIs 83 must breach both the top and bottom of the ICs 16$_x$. Instead, the TWIs 83 may stop at a first conductive layer (e.g., a metal 1 layer) for example. If needed to pass the TWI signal further, normal vias, as would appear in the active circuitry 96, could be used to pass the TWI 83 signal to higher conductive layers in the IC 16$_x$. Therefore, the TWIs 83 as illustrated in FIG. 3 and elsewhere in this disclosure are merely exemplary, and actual commercial embodiments may differ in their construction details.

The reduced swing—high midpoint-voltage signal from the TWI 83 is coupled to the receiver 200 at the receiving IC, again by a similar node 97 which provides a direct connection. Receiver 210 is taken from the above-incorporated '552 application, and therefore its operation is not detailed here. Simply, the receiver 210 takes in the reduced swing—high midpoint-voltage signals (0.8V; 1.2V) and converts them to full swing signals (0.0V, 1.2V) at an output node, Vout, where they can be used by other circuitry in the receiving IC. Such receiver circuitry can be tuned in accordance with techniques and circuitry disclosed in the '552 application, which again are not reiterated here for brevity.

Use of reduced swing—high midpoint-voltage signaling represents one way in which TWI capacitance can be reduced in accordance with an embodiment of the invention. Another embodiment for achieving this same goal in shown in FIGS. 6A through 8. In this embodiment, signals are AC coupled to the TWI 83 via capacitance $C_{AC}$, while the TWI 83 is explicitly biased to a relatively high DC level, for example 3.0V. This explicit bias provides a reference voltage for the AC coupled data on the TWI 83, which increases the overall voltage on the TWI, as will be explained in further detail later. The effect of doing this is shown using the CV curve of FIG. 8. In FIG. 8 a standard directly-coupled reduced swing—low midpoint-voltage signal (0.0V, 0.4V) (scheme 'B') is compared to that same signal when AC coupled to a TWI 83 having a 3V explicit bias (scheme 'D'). The effect of scheme D is to provide signals on the TWI 83 which swing between 2.8V (logic '0') and 3.2V (logic '1').

As shown in FIG. 8, and as discussed previously with respect to FIG. 5, the standard reduced swing—low midpoint-voltage signal biases the TWI 83 toward the depletion region and consequently relatively high capacitance values. By contrast, the AC-coupled, DC-biased approach boosts both data states in the TWI 83 to beyond the threshold voltage of the TWIs 83, Vt (e.g., 2.5V), i.e., into the inversion region. On this part of the CV curve, the capacitance approaches its minimum, and is relatively flat. This provides two of the benefits noted previously: improved high frequency operation, and ease/uniformity in modeling the TWI 83's capacitance.

Figure 6A:
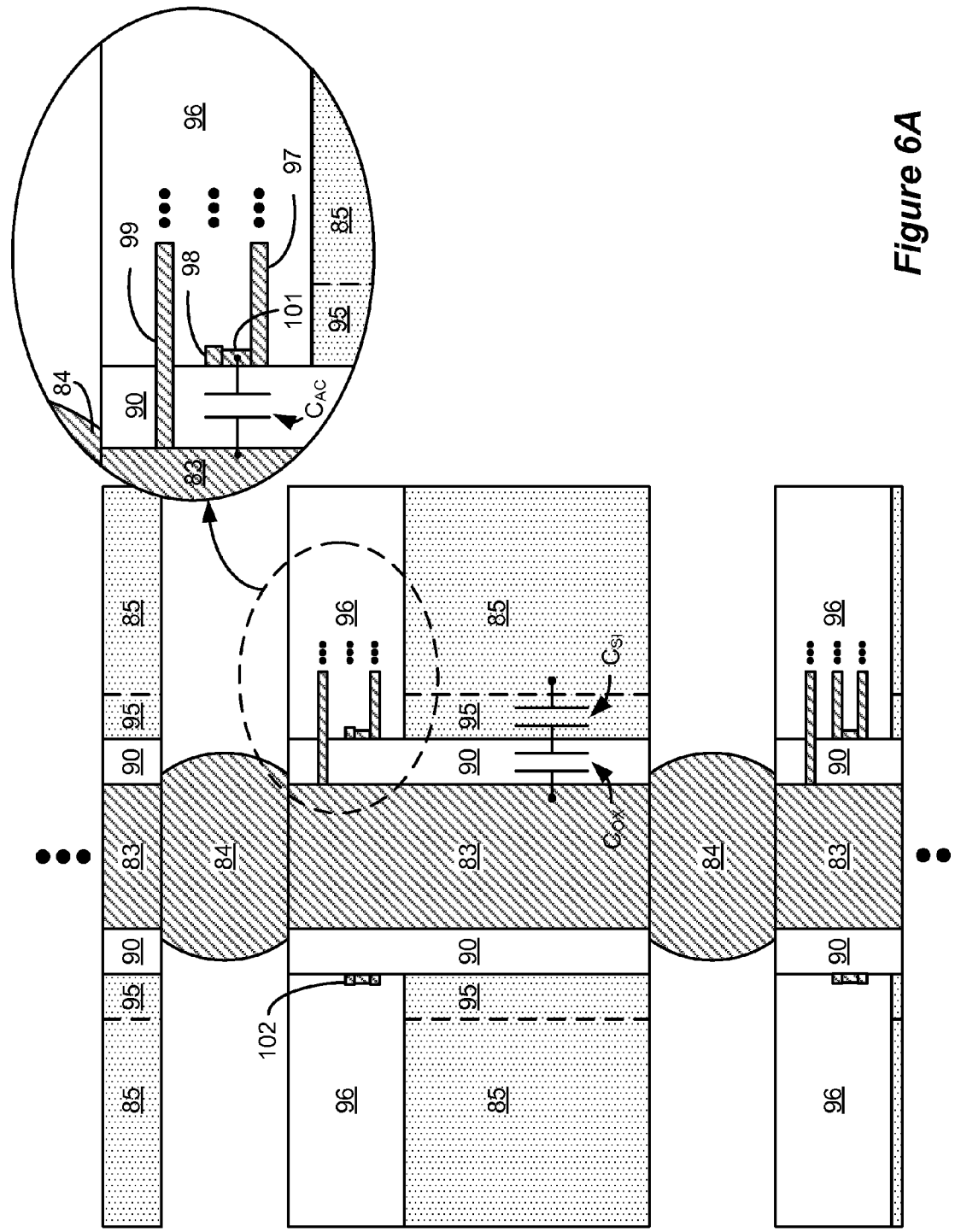
FIGS. 6A and 6B illustrate another embodiment of the invention in which signals are AC coupled to explicitly biased TWIs.
Figure 6B:
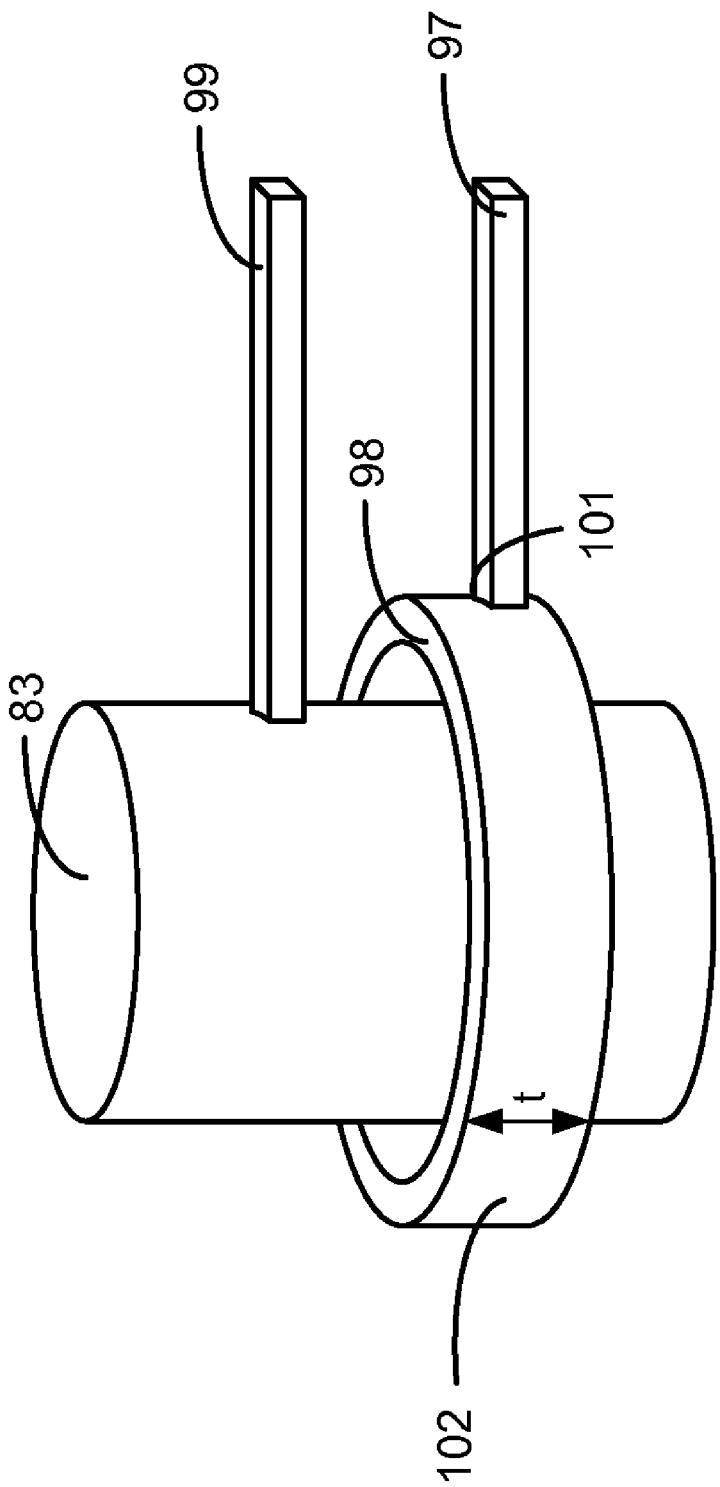

Implementation of the AC coupled, explicitly biased technique is shown in FIGS. 6A though 7. FIGS. 6A and 6B show the fabrication details, and in particular show both the AC coupling and explicit bias connections to the TWI 83. Node 97, as before, represents the signal to be passed to the TWI 83 by the driver circuit, although in this case such passage occurs through AC coupling. Specifically, coupling occurs through a capacitance, $C_{AC}$, formed using the TWI dielectric 90. To increase this capacitance, separate conductive layers within the active circuitry 96 can be used to form a ring 102 around the TWI 83. For example, ring 102 can be formed using a first conductive layer 97 coupled to a second conductive layer 98 by way of a large via 101, or several smaller vias in a roughly circular shape. As best seen in FIG. 6B, the use of multiple conductive layers produces a ring 102 with some thickness, t, which increases the area, and hence the capacitance $C_{AC}$, between the ring and the TWI 83. Other conductive layers could likewise be used to form an even thicker ring 102, although this is not shown for clarity. The ring 102 or other conductive structure can also be formed at least partially around the TWI 83 and the dielectric 90, and need not complete surround the TWI.

Node 99 represents the explicit bias provided to the TWI 83 by a direct connection. Such connection can occur at a third conductive layer of the active circuitry 96, if the first and second conductive layers are used to form the AC coupling ring 102. However, it should be noted that the particulars of how the AC or DC coupling to the TWI 83 occurs, at which conductive layers and with which geometries, etc., is unimportant in the broader context of the invention, and what is illustrated in FIGS. 6A and 6B is merely an example of one implementation.

Figure 7:
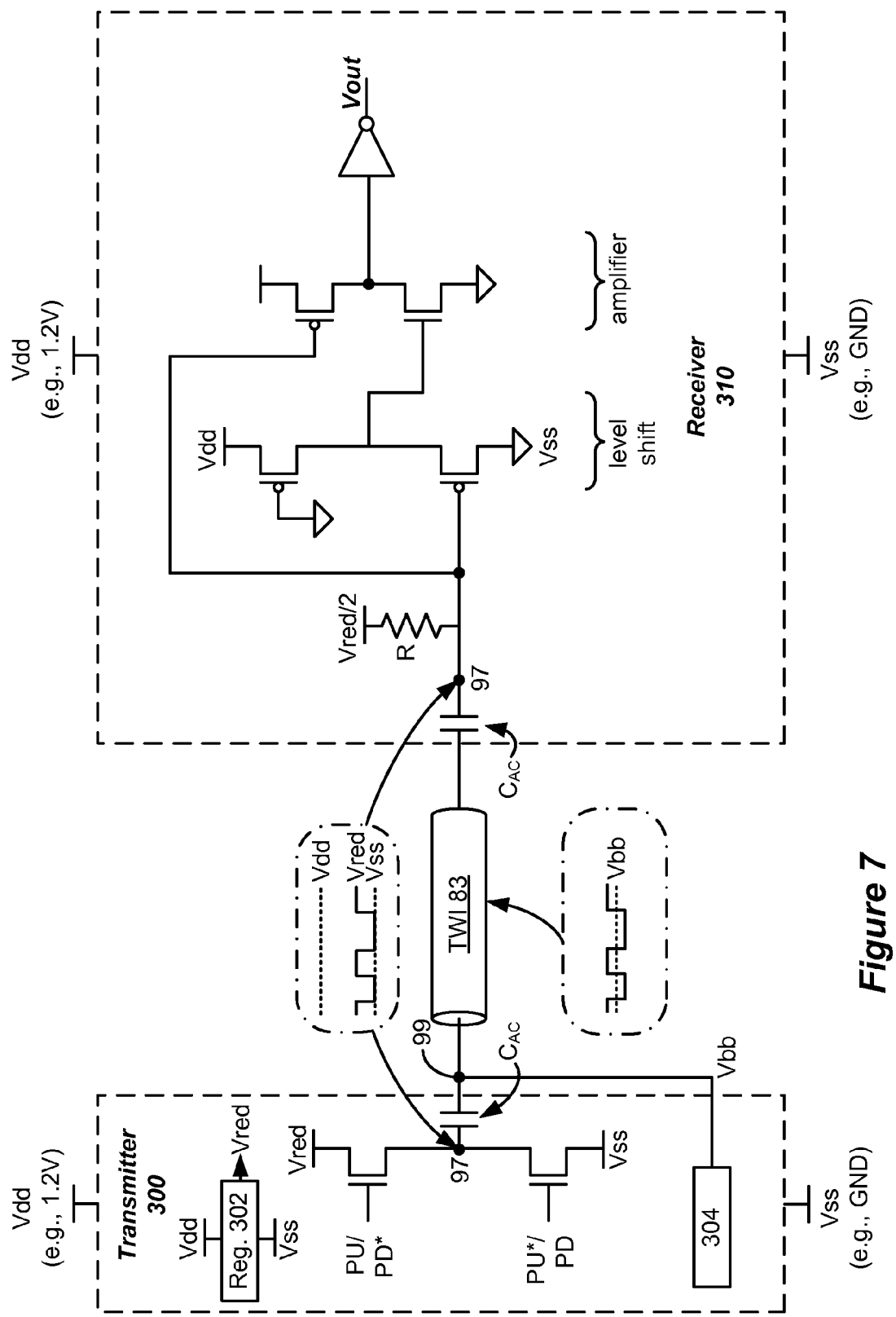
FIG. 7 illustrates transmitter and receiver circuitry useable with the TWI-based bus in accordance with the AC coupled, explicitly biased TWI scheme of FIGS. 6A and 6B.
Figure 8:
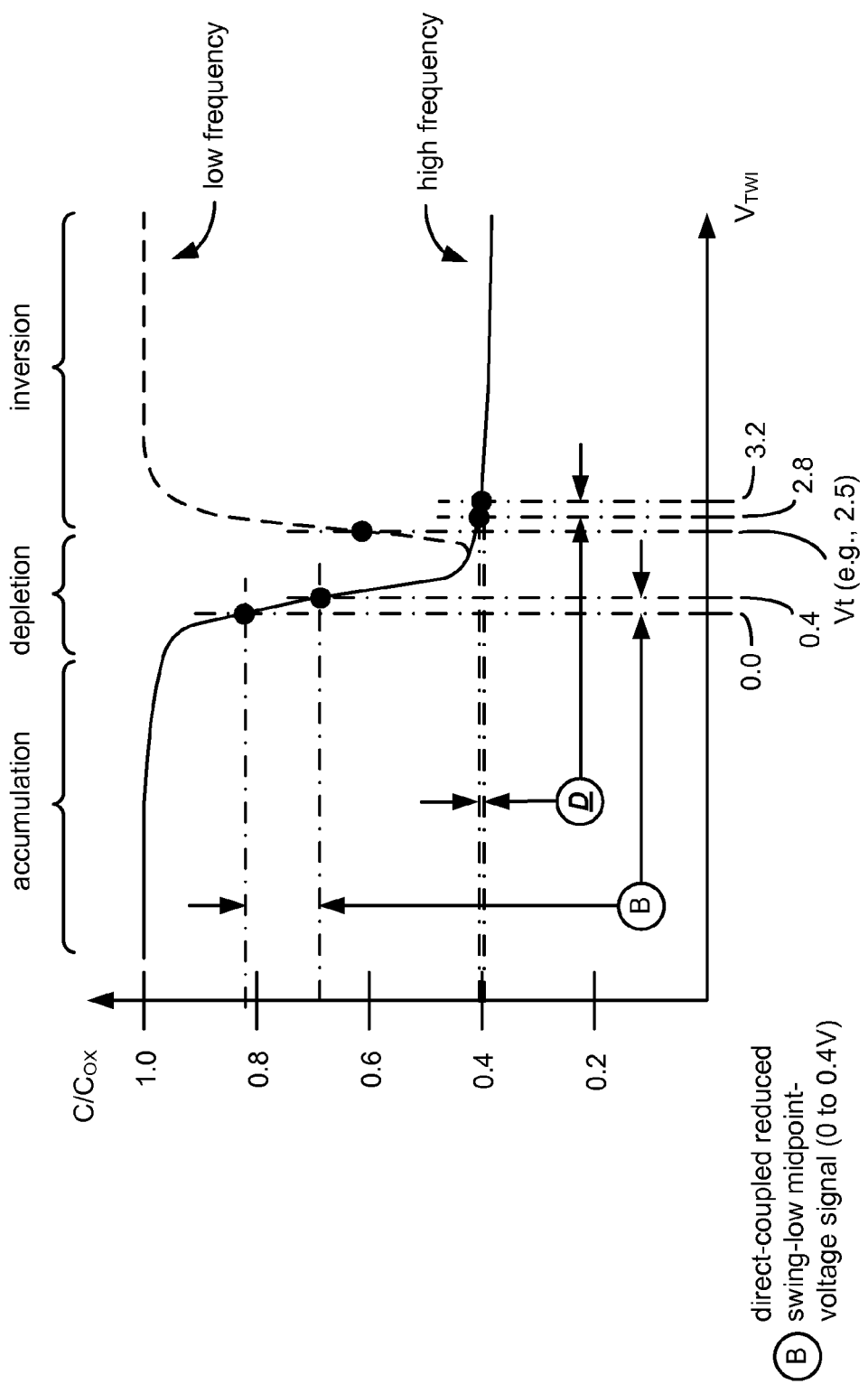
FIG. 8 illustrates how the AC coupled, explicitly biased TWIs scheme reduces TWI capacitance.

Transmission and receiver circuitry 300 and 310 for the AC coupled, explicitly biased technique are shown in FIG. 7. In the embodiment depicted, the transmitter 300 includes a driver circuit formed of two serially-connected N-channel transistors which produces a reduced swing—low midpoint-voltage data signal. As before, these transistors would be fabricated in the active circuitry 96 of one of the ICs (see FIG. 6A). Once again, any of signals PU or PD comprise original signals which are desired to be transmitted onto the TWIs 83, and which may comprise full swing signals ranging around a midpoint voltage of 0.6V. A reduced supply, Vred (e.g., 0.4V) couples to the top N-channel transistor while Vss (e.g., ground; 0.0V) couples to the bottom N-channel transistor. Reduced supply Vred can be formed via a regulator circuit 302, which can comprise any well known band gap generator circuit. Alternatively, this reduced supply Vred can be provided from the system outside of the ICs. In any event, how the reduced supply Vred is generated is unimportant. The driver circuitry is controlled by mutually-exclusive pull up (PU)/pull down (PD) signals, such that when PU is asserted (active high), 0.4 V (i.e., a logic '1') is created at node 97, which establishes a midpoint voltage of 0.2V; when PD is asserted (active high), 0.0V (i.e., a logic '0') is created at node 97.

An explicit DC bias voltage, Vbb, is provided to the TWI 83 via direct connection 99. Vbb can be generated by a bias circuit 304, which can reside on the ICs 16$_x$, or which can also reside elsewhere in the system. Because Vbb may be relatively large, bias circuit 304 can comprise a charge pump circuit; again, how supply Vbb is generated is unimportant. Once provided to TWI 83, explicit bias Vbb operates as a midpoint reference voltage for the signals coupled to the TWI from node 97. Accordingly, if the signals as produced by the driver circuitry are 0.0V and 0.4V, and if Vbb=3.0V, then the boosted signals present on the TWI 83 at node 99 will equal 2.8V (logic '0') and 3.2V (logic '1'). In other words, node 99 represents a modified signal ranging around a midpoint voltage of 3.0V. As noted earlier in conjunction with FIG. 8, such voltage levels for the logic states beneficially result in lower TWI capacitance.

The signals on the TWI 83 are similarly AC coupled to the receiver 310 at the receiving IC, again by a similar node 97 and via a dielectric 90 capacitance, $C_{AC}$. To remove the explicit bias voltage Vbb from the signal at the receiver 310, node 97 is pulled to a DC level of reference voltage Vred/2 (e.g., 0.2V) via a pull-up resistor, R. (The pull-up resistor R can comprise an appropriately biased transistor). The effect is that the logic states center around this new DC reference midpoint voltage at the receiver 310, and so adjusts the received signal to its original reduced swing—low midpoint-voltage levels of 0.0V (logic '0') and 0.4V (logic '1'). Thereafter, the depicted receiver 310 translates these voltages to full swing signals (0.0V, 1.2V) at the output node, Vout, where they can be used by other circuitry in the receiving IC. Operation and tuning of receiver circuitry 310 is disclosed in the above-incorporated '552 application, and so is not reiterated here for brevity. However, it is not strictly required that the receiver translate voltages to full swing levels immediately, and this is especially true if the receiving device can handle and process less than full swing signals.

Figure 9:
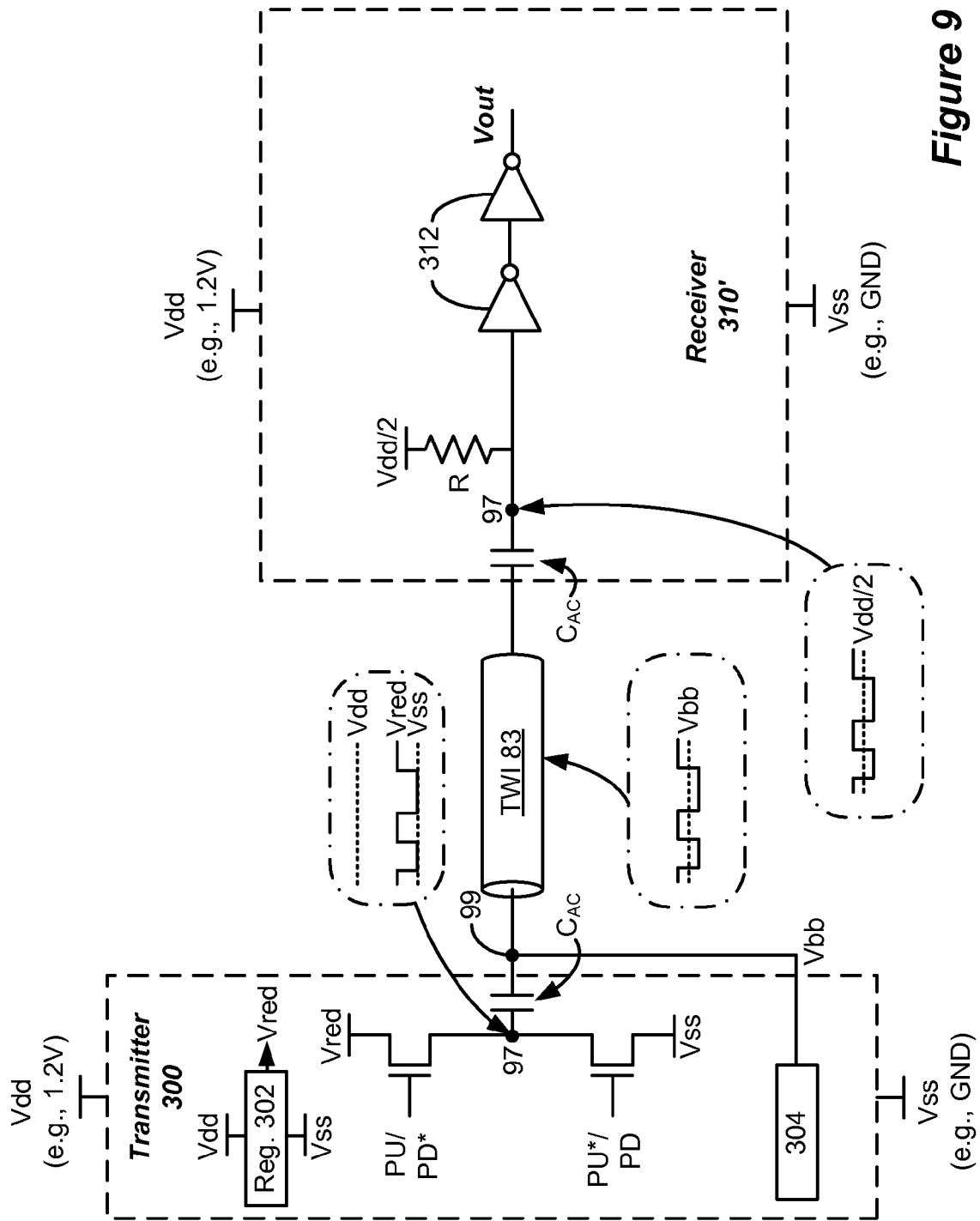
FIG. 9 illustrates another embodiment of a simplified receiver useable in the AC coupled, explicitly biased TWI scheme.

Another embodiment of the AC coupled, explicitly biased technique is illustrated in FIG. 9. The difference when compared with FIG. 7 lies in the receiver circuitry 310'. In receiver 310', a reference midpoint voltage of ½ Vdd (e.g., 0.6V) is set through the pull-up resistor at node 97. This forces the AC coupled data signal from the TWI 83 to center around this level, such that a logic '0' at node 97 at the receiver 310' equals 0.4V while a logic '1' equals 0.8V. With the logic states reconstituted at node 97 in this fashion, simple inverters 312 can be used to differentiate between the logic states. This is because the inverters 312 are powered by the receiver's Vdd and Vss power supplies, and will generally trip at the midpoint (Vdd/2) between these voltages. Two of such inverters 312 (two are used to preserve the polarity of the data state) therefore provide a reliable, buffered, full swing data signal usable by other circuitry in the receiver 310'. Such a receiver 310' may not require additional tuning circuitry as might be the case with receiver circuitry 310 of FIG. 7 (see the above-incorporated '552 application). Receiver 310' thus illustrates another desired benefit of the AC coupled, explicitly biased technique: the ability to choose any reference voltage at the receiver 310' useful to assist in sensing the data, and useful to simplifying receiver design.

While the AC coupled, explicitly biased techniques of FIGS. 6A through 9 have illustrated transmission of a reduced swing—low midpoint-voltage data signal, this is merely for simplicity. It is not important to these embodiments of the invention that a reduced swing signal be used. Generally, the beneficial aspect of these embodiments is the provision of the explicit bias voltage, onto which AC coupled signals are superimposed and by which the TWI 83 capacitance is biased toward inversion, i.e., minimal capacitance on the CV curves (see FIG. 8). This beneficial effect occurs even when full swing signals, or reduced swing—high midpoint-voltage signals, are generated by the driver circuitry at the transmitter 300. Hence, use of reduced swing—low midpoint-voltage driver circuitry and signals should be understood as merely illustrative of the benefits that the AC coupled, explicitly biased technique of FIGS. 6A-9 can provide.

The disclosed techniques increase the absolute voltage of the data on the TWIs 83 with respect to the substrate potential. This is because when the ICs in the multi-IC system 40 use P-doped substrates, higher voltages will bias the TWI capacitance further toward inversion, and hence toward lower values. However, should N-doped substrates be used, adaptations of the disclosed techniques would seek to reduce rather than raise the voltage of the data states present on the TWIs 83 (with respect to the substrate), because this would bias the local N-substrate and hence the TWI 83 capacitance toward inversion. Because use of N-doped substrates is relatively rare, and because little additional understanding would result from specific illustration of such adaptations, the same is not illustrated in the Figures. However, one skilled in the art would understand how to implement such adaptations based on the details provided in this disclosure.

In the embodiments illustrated to this point, it has been assumed that the substrate 85 is held at traditional levels (e.g., 0V for a P-doped substrate). However, this is not required, and embodiments of the technique can still have the beneficial effect of reducing TWI capacitance even if non-traditional substrate voltages are used. For example, it may be beneficial in a DRAM application to use a negatively-biased substrate 85 to improve data retention in the array of DRAM memory cells.

Figure 10:
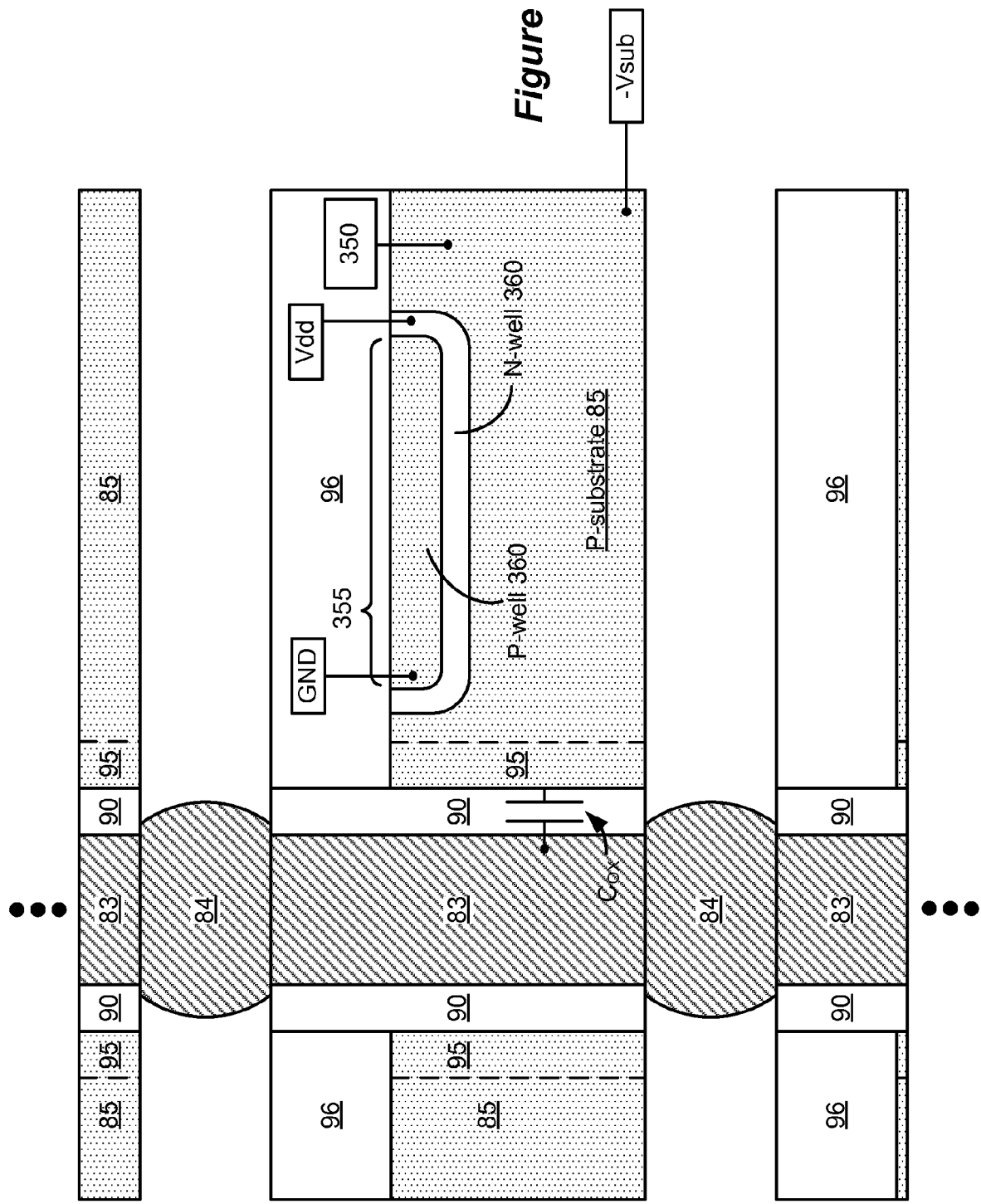
FIGS. 10 and 11 illustrate another embodiment of the invention in which substrate bias is explicitly biased to affect TWI capacitance.
Figure 11:
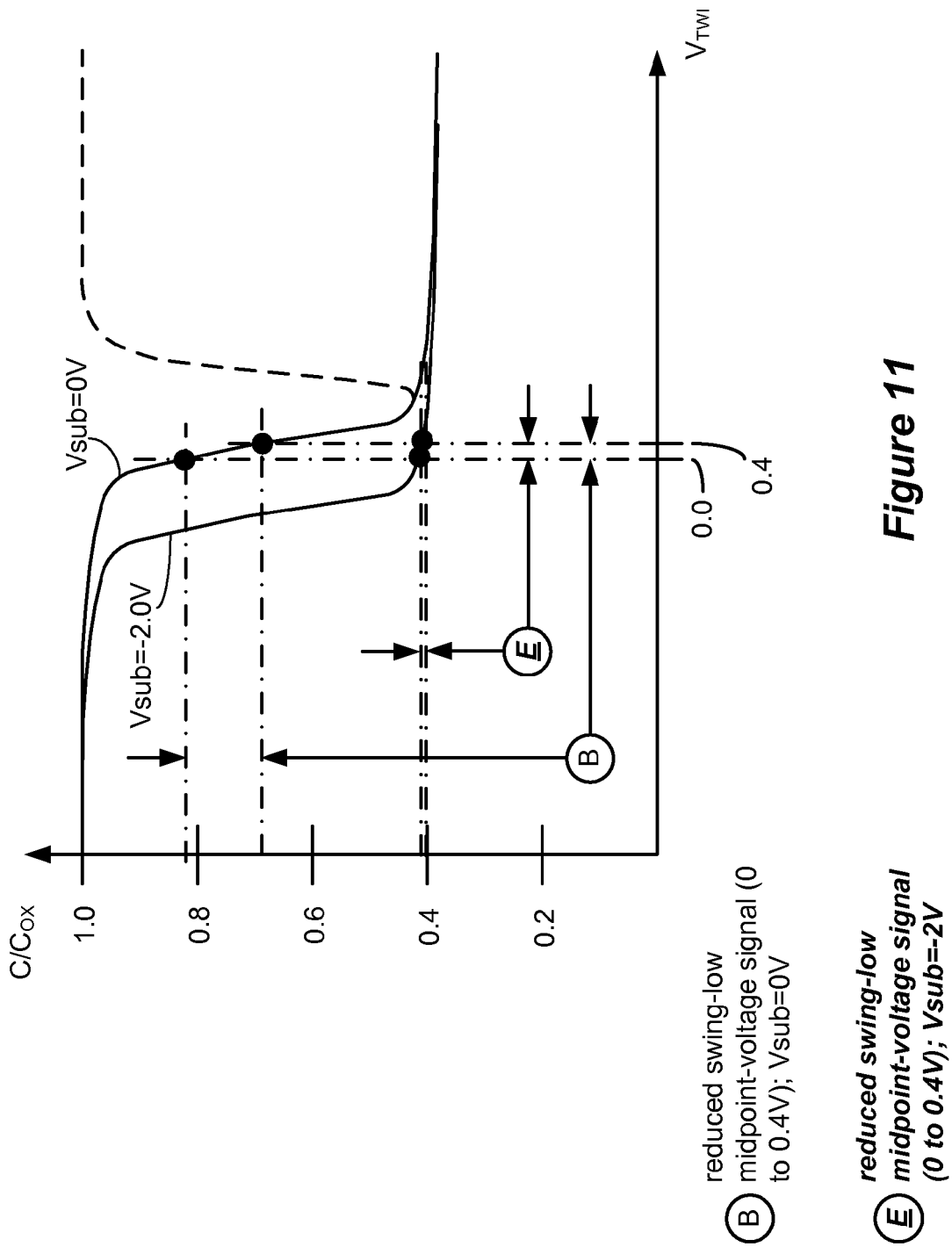

Similarly, biasing of the substrate 85 can be used to intentionally minimize TWI 83 capacitance, and so comprises another embodiment of the invention illustrated in FIGS. 10 and 11. As shown in FIG. 10, a bias circuit 350 is used to provide a negative explicit bias voltage, −Vsub, to the P-doped substrate 85. At the same time, active circuitry 355, including the transmitter and receiver circuitry and likely other or possibly all other operable circuits on the IC, can be built in a P-well 360 formed in the substrate 85. This P-well 360 is isolated from the P-substrate 85 by a positively-biased intervening N-well 360, which provides reversed-biased diode isolation. The result is that active circuitry 355 can be built in the P-well 360 powered in accordance with standard power supplies of Vdd and GND, even though the substrate 85 is negatively biased. Of course, other structures could be used to isolate the active circuitry 355 from the substrate 85, such as with the use of a buried oxide layer, etc.

As shown in FIG. 11, the negative substrate bias affects the TWI 83 capacitance, and the effect of having a −2.0V substrate bias is specifically shown as one example. As shown, the effect of the negative substrate bias is to move the CV curve to the left, i.e., to lower voltages. Also shown are the TWI 83 capacitances induced by reduced swing—low midpoint-voltage signals (0 to 0.4V) for Vsub=0.0V (scheme 'B') and Vsub=−2.0V (scheme 'E'). Because a negative substrate voltage tends to bias the TWI 83 capacitance towards a minimum, i.e., toward inversion, the capacitances for these data states are minimized and bought into conformity.

As was the case with the AC coupled, explicitly biased approach of FIGS. 6A-9, the negative-substrate-bias scheme of FIGS. 10 and 11 reduces TWI capacitance regardless of the particular signaling scheme used. Thus, while reduced swing—low midpoint-voltage signaling was illustrated in FIGS. 10 and 11, it should be understood that other signaling schemes (full swing; reduced swing—high midpoint voltage) would also benefit from the negative substrate biasing scheme illustrated. Additionally, although illustrated as operating with a negative substrate bias, one skilled in the art, upon reviewing this disclosure, will recognize that biasing the TWI 83 capacitance toward inversion will not always require negative substrate voltages. For example, if N-doped substrates are used, positive substrate biases would be indicated in accordance with this embodiment of the invention.

Although the disclosed embodiments have shown the transmitter and receiver circuitry built on each of the ICs 16$_x$ having the TWIs 83, it should be understood that either circuitry may be located off of the multi-IC system 40. For example, locating the transmitter circuitry elsewhere in the system may provide optimal biasing to the bus 15/TWIs 83 to achieve the low capacitance/high speed goals discussed herein, with only the receiver circuitry being present on the ICs 16$_x$ having the TWIs 83. In fact, the receiver circuitry could also be off of the ICs 16$_x$ having the TWIs 83. In these modifications, the benefits of the technique can still be had even if the transmitter and receiver circuitry are not on the ICs 16$_x$ containing the TWIs 83, so long as appropriate signal levels are used on the bus 15/TWIs 83 to minimize their capacitance by biasing TWI capacitance towards inversion. Similarly, the bias circuits (304 of FIGS. 7 and 9; 350 of FIG. 10) may reside either on or off the ICs 16$_x$.

Although illustrated in the context of a vertically stacked, multi-IC system 40, it should be understood that one can implement the technology disclosed herein when only one IC with at least one TWI 83 is used.

Note that when multiple ICs are used in a vertically-stacked system, the transmitter circuit may output its signal to one TWI in one IC, while the receiver may receive that signal from another TWI in another IC. However, because the TWIs in the two ICs will be electrically coupled, one can consider the electrically coupled TWIs to comprise a single node for all intents and purposes. Thus, if the transmitter outputs its signal to a TWI, the receiver circuit will still receive a signal from that TWI, even if the receiver is on a different IC or even off the system 40 altogether. The claims should be interpreted with this in mind.

Embodiments of the invention are illustrated herein as having applicability to through wafer interconnects (TWIs). However, one skilled in the art will realize that the disclosed techniques also have applicability to interconnects more generally, even if they are not through a wafer. For example, a via (a type of vertical interconnect) between conductive layers on an integrated circuit (e.g., between two metal layers) can be envisioned as passing through materials similar in electrical activity to a traditional semiconductor substrate. For example, such a material could comprise other forms of depositable semiconductors, such as polysilicon. If a via passes through such a material, that via may have a voltage-dependent capacitance, although perhaps not quite as pronounced as those depicted in the CV curves herein. Accordingly, the same techniques described here could be used to reduce the capacitance of those vias/interconnects. Moreover, the techniques described herein can have applicability to non-vertical interconnects as well.

Additionally, it should be understood that the stack-up or semiconductor layering of the wafer in question need not correspond to a complementary-metal-oxide-semiconductor (CMOS) based technology. In other words, the methods presented herein could apply to other forms of semiconductor technology, including, but not limited to, bi-polar junction transistor (BJT), hetero-junction bi-polar transistor (HBT), silicon-germanium (SiGe), and silicon-on-insulator (SOI) based semiconductor manufacturing processes.

While certain embodiments of the invention have been disclosed, it should be understood that other embodiments can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A system, comprising:
   at least one integrated circuit;
   a through wafer interconnect in the integrated circuit, wherein the through wafer interconnect passes a signal vertically through the integrated circuit;
   a transmitter, wherein the transmitter operates at power supply voltages comprising a first voltage and a second voltage, wherein the transmitter outputs to the through wafer interconnect a reduced swing signal ranging from the first voltage to a third voltage, the third voltage being between the first and second voltages;
   a receiver for receiving from the through wafer interconnect the reduced swing signal,
   wherein the third voltage reduces a capacitance of the through wafer interconnect when compared to the second voltage.

2. The system of claim 1, wherein either the transmitter or the receiver are formed on one of the at least one integrated circuit.

3. The system of claim 1, wherein neither the transmitter nor the receiver are formed on the at least one integrated circuit.

4. The system of claim 1, wherein the through wafer interconnect is separated from a substrate of the integrated circuit by a dielectric forming a capacitor.

5. The system of claim 4, wherein the third voltage reduces the capacitance by biasing the capacitor towards inversion.

6. The system of claim 1, wherein the integrated circuit comprises a grounded p-doped substrate and wherein the first voltage is Vdd, the second voltage is ground, and the third voltage is between Vdd and ground.

7. The system of claim 1, wherein the system comprises a plurality of integrated circuits, and wherein the integrated circuits are vertically stacked.

8. The system of claim 7, wherein the plurality of integrated circuits are packaged together.

9. The system of claim 7, wherein the transmitter and the receiver are formed on different ones of the plurality of integrated circuits.

10. The system of claim 1, wherein the reduced swing signal comprises a reduced swing—high midpoint-voltage signal.

11. A system, comprising:
    at least one integrated circuit;
    a through wafer interconnect in the integrated circuit, wherein the through wafer interconnect passes a signal vertically through the integrated circuit;
    a transmitter, wherein the transmitter circuit AC couples its output signal to the through wafer interconnect;
    a bias circuit for providing an explicit bias voltage to the through wafer interconnect;
    a receiver, wherein the receiver circuit AC couples to the through wafer interconnect to receive the output signal,
    wherein the explicit bias voltage biases a capacitance of the through wafer interconnect toward inversion.

12. The system of claim 11, wherein the receiver is configured to remove the explicit bias voltage from the received output signal.

13. The system of claim 11, wherein the receiver is configured to adjust the received output signal to the same levels as output by the transmitter.

14. The system of claim 11, wherein the receiver is configured to adjust the received output signal to levels compatible with a receiving integrated circuit.

15. The system of claim 11, wherein the receiver is configured to adjust the received output signal by establishing a reference voltage relative to levels of the received output signal, wherein the reference voltage comprises a midpoint voltage between power supply voltages of the receiver.

16. The system of claim 11, wherein the integrated circuit comprises a grounded p-doped substrate and wherein the explicit bias voltage is positive.

17. The system of claim 11, wherein either or both of the transmitter or the receiver AC couples to the through wafer interconnect via a capacitor.

18. The system of claim 17, wherein the capacitor comprises a dielectric that insulates the through wafer interconnect from a substrate of the integrated circuit.

19. The system of claim 18, wherein the capacitor further comprises a conductive structure formed at least partially around the through wafer interconnect and the dielectric.

20. The system of claim 11, wherein the explicit bias voltage comprises a DC bias voltage.

21. A system, comprising:
    at least one integrated circuit, the integrated circuit comprising a substrate;
    a through wafer interconnect in the integrated circuit, wherein the through wafer interconnect passes a signal vertically through the substrate;
    a transmitter, wherein the transmitter circuit provides its output signal to the through wafer interconnect;
    at least one bias circuit for providing an explicit bias voltage to the substrate;
    a receiver, wherein the receiver circuit receives the output signal from the through wafer interconnect,
    wherein the explicit bias voltage biases a capacitance of the through wafer interconnect toward inversion.

22. The system of claim 21, wherein the through wafer interconnect is separated from the substrate by a dielectric layer forming a capacitor.

23. The system of claim 21, wherein the integrated circuit comprises a p-doped substrate and wherein the explicit bias voltage is less than or more negative than levels of the output signal.

24. The system of claim 21, wherein the integrated circuit comprises active circuitry, and wherein the active circuit is insulated from the substrate.

25. The system of claim 24, wherein one or more of the transmitter, receiver, and the bias circuit are formed in the active circuitry.

26. The system of claim 21, wherein the explicit bias voltage comprises a DC bias voltage.

* * * * *